United States Patent [19]

Ooyabu

[11] Patent Number: 5,319,584
[45] Date of Patent: Jun. 7, 1994

[54] DIGITAL FILTER
[75] Inventor: Hiroshi Ooyabu, Kyoto, Japan
[73] Assignee: Rohm Co., Ltd., Kyoto, Japan
[21] Appl. No.: 920,790
[22] Filed: Jul. 28, 1992
[30] Foreign Application Priority Data Jul. 29, 1991 [JP] Japan .................. 3-188535

[51] Int. Cl.$^5$ .............................................. G06F 15/31
[52] U.S. Cl. ........................... 364/724.01; 364/724.13
[58] Field of Search ................. 364/724.01, 724.13, 364/724.17, 724.19, 724.2, 724.18, 718, 736; 395/2; 381/31

[56] References Cited

U.S. PATENT DOCUMENTS

| | | | |
|---|---|---|---|
| 4,668,988 | 5/1987 | Sasaki et al. | 364/718 |
| 4,766,561 | 8/1988 | Thompson et al. | 364/724.13 |
| 5,142,489 | 8/1992 | Yamaki | 364/736 |
| 5,157,760 | 10/1992 | Akagiri | 375/2 |

*Primary Examiner*—Long T. Nguyen
*Assistant Examiner*—Chuong D. Ngo
*Attorney, Agent, or Firm*—Wolf, Greenfield & Sacks

[57] ABSTRACT

A digital filter can de-emphasize pre-emphasized signals without an extra processing routine or hardware. Via a second bus 21, a decision unit 19 receives a record status signal out of digital audio signals input by an input-output unit 24, thereby checking whether or not the received signals have been pre-emphasized. When the signals have been pre-emphasized, the decision unit 19 selects a set K2 of multiplication coefficients ($a_0$, $a_1$ and $a_2$). Otherwise, the decision unit 19 selects the other set K1 of multiplication coefficients (−1, 0, 0). In the former case, the input signals are de-emphasized. In the latter case, a transmission function is "−1", so that the input signals are multiplied by "−1", i.e. no de-emphasizing process is carried out.

4 Claims, 7 Drawing Sheets

| STEP | BUS 21 | BUS 16 | MULTI-PLIER 11 | RE-GISTER 12 | ADDER 13 | ACCUMU-LATOR 14 | INPUTTING/ OUTPUTTING |
|---|---|---|---|---|---|---|---|
| 1 | Xn | En-1 | h(0)×Xn=M0 | | | En-1 | Xn INPUT EXTERNALLY |
| 2 | Xn | 0 | h(1)×Xn=M1 | M0 | M0+En-1=Yn | 0 | |
| 3 | Yn | | h(2)×Yn=M2 | M1 | M1+0 = A0 | Yn | Yn OUTPUT EXTERNALLY |
| 4 | | | | M2 | M2+A0 =En | A0 | |
| 5 | | | | | | En | WRITE En IN RAM |

Fig. 5

| DECIMAL | COMPLEMENTS OF 2 |
|---|---|
| 7/8 | 0111 |
| 6/8 | 0110 |
| 5/8 | 0101 |
| 4/8 | 0100 |
| 3/8 | 0011 |
| 2/8 | 0010 |
| 1/8 | 0001 |
| 0 | 0000 |
| -1/8 | 1111 |
| -2/8 | 1110 |
| -3/8 | 1101 |
| -4/8 | 1100 |
| -5/8 | 1011 |
| -6/8 | 1010 |
| -7/8 | 1001 |
| -1 | 1000 |

DIGITAL FILTER

BACKGROUND OF THE INVENTION

1. Field of the Invention

This invention relates to a digital filter and moreparticularly to a digital filter to be used for a digital audio device, for example.

2. Description of the Related Art

Along with recent development in LSI, techniques for digitally processing signals have been remarkably advanced in a variety of fields such as image processing, audio devices and instrumentation. Digital filters are replacing analog filters in these fields. Specifically, digital filters are very popular in audio devices for reproducing information from compact discs (CD) and digital-audio tapes, for example. In such audio devices, signal levels of high tones are somewhat inferior to those of low and middle tones. Therefore, a master tape which serves as an original for producing compact discs is often pre-emphasized so as to raise the signal levels of high tones beforehand, thereby effectively expanding a dynamic range. To reproduce information from a compact disc which is produced from the foregoing master tape, it is necessary to de-emphasize the level via a digital filter connected to a line amplifier of a reproducing device, thereby offsetting the pre-emphasized level.

FIG. 7 of the accompanying drawings shows one example of the pre-emphasizing and de-emphasizing characteristics of a compact disc player. Audio signals recorded on a compact disc are pre-emphasized at the rate of about +6 dB/oct in a frequency band of about 3 KHz to 10 KHz, and are uniformly pre-emphasized at the rate of 10 dB in a frequency band of more than 10 KHz. When reproducing such a compact disc, the audio signals are de-emphasized at the rate of −6 dB/oct in the frequency band of about 3 KHz to 10 KHz, and are uniformly de-emphasized at the rate of −10 dB in the frequency band of more than 10 KHz.

Usually, the digital audio signals are de-emphasized by a digital filter. It is not necessary to de-emphasize audio signals which have not been pre-emphasized. With the prior art, a control routine is executed to determine whether or not to de-emphasize the signals, as shown in a flowchart of FIG. 8. Specifically, necessity of the de-emphasizing process is checked based on a code indicating the pre-emphasized state in control codes reproduced together with the digital audio signals on the compact disc (in a step S101). When the de-emphasizing process is necessary (YES in a step S102), the reproduced signals are de-emphasized by the digital filter according to a predetermined routine (in a step S103). Otherwise, the reproduced signals will be transmitted without de-emphasis via the digital filter in a step S104.

With the prior art, the necessity of the de-emphasizing process is determined depending upon whether or not the reproduced signals are input to the digital filter. A control routine for this purpose is required as well as the routine for controlling the digital filter itself. A selector circuit for this purpose is also required, which causes an increase in software and hardware for the de-emphasizing process.

SUMMARY OF THE INVENTION

It is an object of the present invention to overcome the problems in the prior art discussed above and to provide a digital filter which can perform filtering such as de-emphasizing without the increase of an extra processing routine or hardware.

According to the invention, a digital filter comprises a multiplier, a delay circuit and an adder so as to filter particular characteristics of input signals according to filtering coefficients applied in the multiplier. There are two sets of the filtering coefficients. A first set of coefficients is for filtering particular characteristics of input signals. A second set of coefficient is "−1" as the filtering coefficient of degree 0, and "0" as the other filtering coefficients. The second set of coefficients is used when no filtering is executed for the particular characteristics of the input signals.

According to one aspect of the invention, when no particular characteristics of the input signals are filtered, the filtering coefficient of degree 0 is "−1", and is "0" for other degrees. In this case, the input signals are multiplied by "−1", so that the filtering function for the particular characteristics is turned off.

With another aspect of the invention, a control signal which is input prior to digital audio signals to be filtered is checked so as to determine whether or not the particular characteristics of the digital audio signals should be filtered. Either the first or second set of the filtering coefficients is selected according to the checked result.

The foregoing checking is automatically carried out for signals coming from various sources.

The invention is most advantageously applied to a digital filter for de-emphasizing signals which have been pre-emphasized so as to raise signal levels in a high frequency band.

BRIEF DESCRIPTION OF THE DRAWINGS

FIG. 5 shows actual filtering functions of the digital filter;

FIG. 6 is a table showing two's complements to be used for the digital filter;

DESCRIPTION OF THE PREFERRED EMBODIMENT

Figure 1:
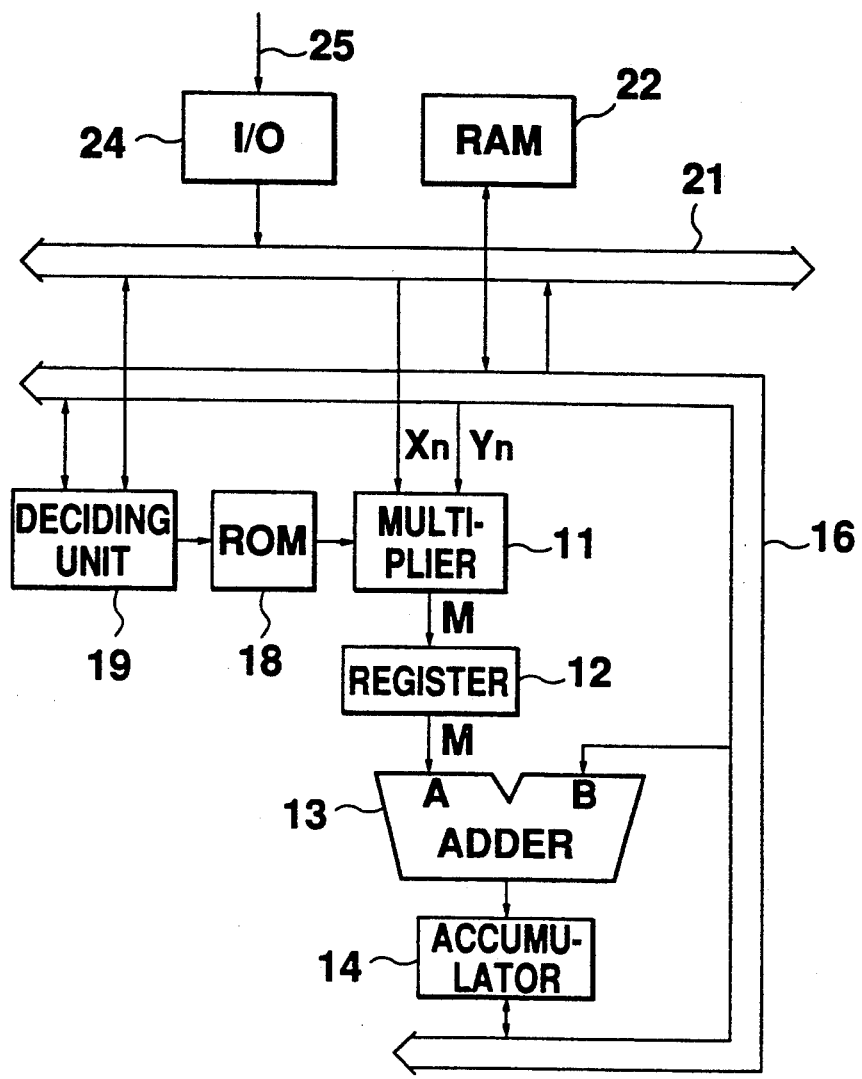
FIG. 1 is a block diagram of a digital filter according to an embodiment of the present invention.

FIG. 1 is a block diagram showing a digital filter and its peripheral circuit according to an embodiment of the present invention. The circuit includes a multiplier 11, which is connected to an input terminal A of an adder 13 via a register 12. An output terminal of the adder 13 is connected to a first bus 16 via an accumulator 14. An input terminal B of the adder 13 is connected to the first bus 16.

Figures 2, 3:
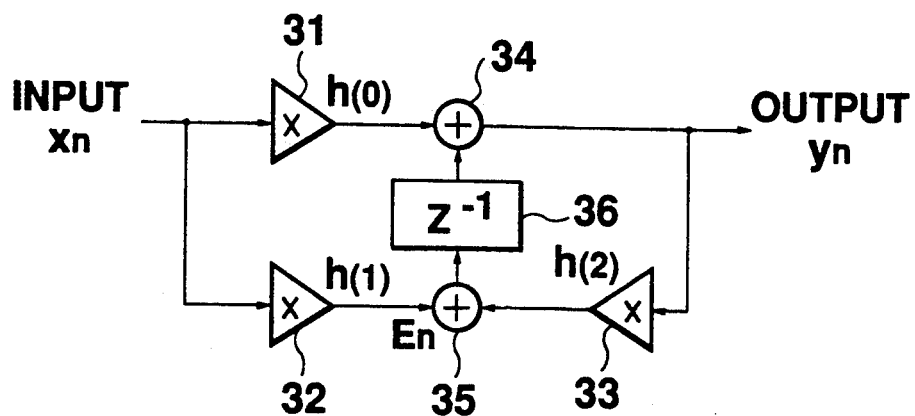
FIG. 2 shows contents of a read-only memory (ROM) of the digital filter of FIG. 1.
FIG. 3 is an equivalent diagram of the digital filter.

A read-only memory (hereinafter referred to as ROM) 18 is connected to the multiplier 11, and is also accessible to a decision unit 19, which is connected to the first bus 16 and a second bus 21. As shown in FIG. 2, the ROM 18 stores two sets K1 and K2 of multiplication coefficients h(0), h(1), and h(2). Either of K1 and K2 is read to be set in the multiplier 11. These multiplication coefficients are represented by two's complements as shown in FIG. 6, and can be any one of 16 values from a minimum value of "−1" to a maximum value of "⅞". As can be seen from FIG. 2, K1 is −1, 0 and 0, while K2 is $a_0$, $a_1$ and $a_2$. K2 is preliminarily determined for the digital filter to optimally perform the de-emphasizing process.

The first and second buses 16 and 21 are interconnected. The first bus 16 is connected to a random-access memory (RAM) 22, and the second bus 21 is connected to an input/output unit (I/O) 24. The I/O 24 receives from an external circuit (not shown) a digital audio signal 25 which is to be filtered. The RAM 22 is used as a buffer memory to perform digital filtering.

The digital filter having the foregoing configuration is equivalently shown in FIG. 3. In FIG. 3, multipliers 31 to 33 are equivalent to the multiplier 11 of FIG. 1 while adders 34 and 35 are equivalent to the adder 13 of FIG. 1. A delay circuit 36 corresponds to the register 12 of FIG. 1. A transmission function of the digital filter is expressed by:

$$H(Z) = (h(0) + h(1)Z^{-1})/(1 + h(2)0Z^{-1}) \qquad (1)$$

The operation of the digital filter will be described with reference to FIG. 4. The digital audio signals 25, which are reproduced from a recording medium such as a compact disc and have a predetermined bit width, are input to the second bus 21 via the input/output unit 24. The recording medium also carries a control signal indicating whether or not the digital audio signals have been pre-emphasized (hereinafter referred to as the "record status signal"). The record status signal is reproduced and input to the second bus 21 prior to the digital audio signals.

Figure 4:
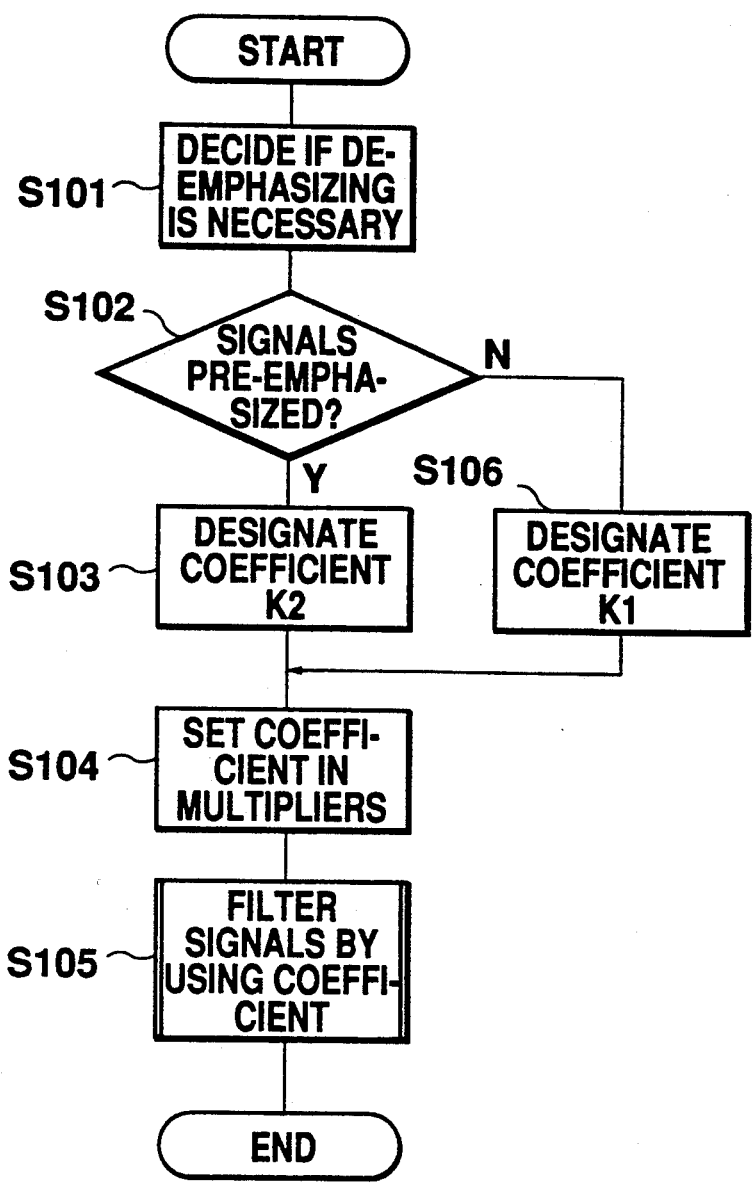
FIG. 4 is a flowchart showing the operation of the digital filter.
Figure 7:
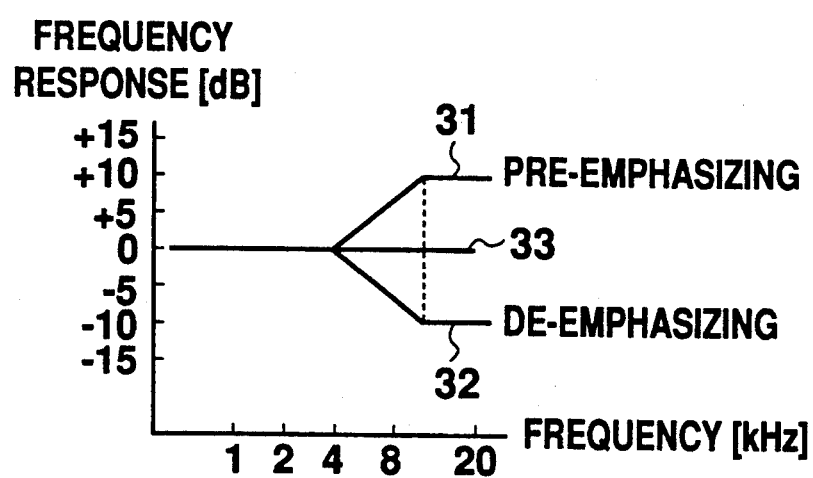
FIG. 7 shows frequency characteristics of pre-emphasizing and de-emphasizing processes.
Figure 8:
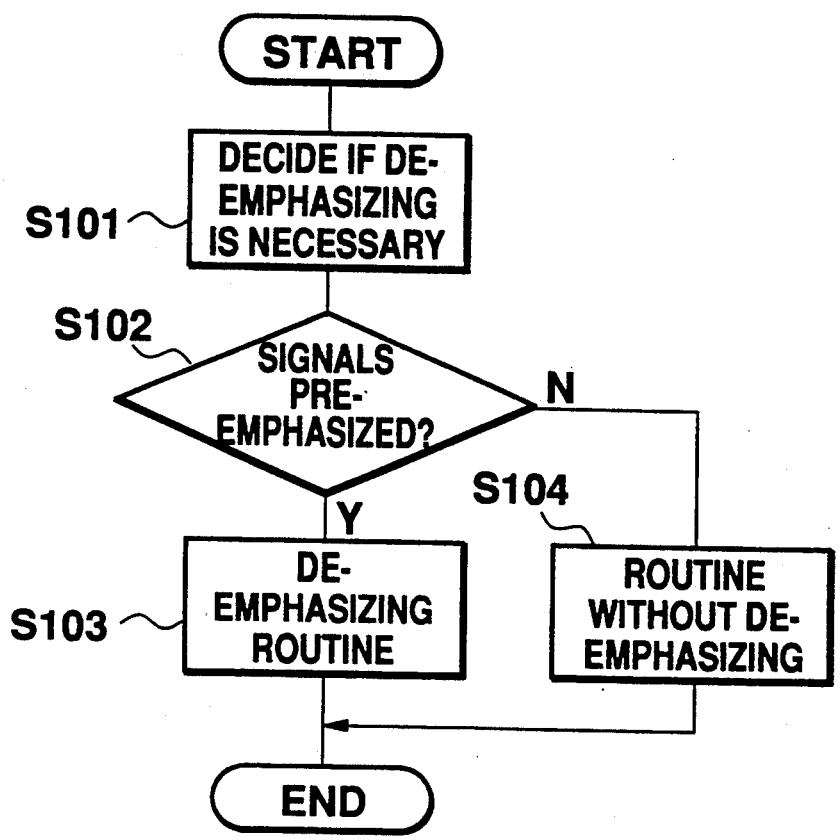
FIG. 8 is a flowchart of a routine for determining whether or not the de-emphasizing process is necessary in a prior art digital filter.

The decision unit 19 receives the record status signal from the second bus 21, detecting whether or not the succeeding digital audio signals 25 have been pre-emphasized (in a step S101 shown in FIG. 4). When the record status signal indicates the existence of pre-emphasis (e.g. the reproduced signals have the pre-emphasized characteristics shown by a solid line 31 in FIG. 7), the decision unit 19 determines to de-emphasize the reproduced signal in a step S102 (Y), issuing a signal to this effect to the ROM 18. The coefficient set K2 is designated in a step S103 as the multiplication coefficients to execute the succeeding filtering operation. Then, the multiplication coefficients are applied in the respective multipliers, in a step S104. The digital audio signals input from the input/output unit 24 in succession are converted according to the transmission function expressed by the formula (1). K2 includes multiplication coefficients $a_0$, $a_1$ and $a_2$ as shown in FIG. 2. Thereafter, the digital audio signals are de-emphasized in a step S105 as shown by a solid line 32 of FIG. 7, so that the signals will be reproduced to have frequency characteristics equivalent to those of the original signals.

When the record status signal does not indicate that the reproduced signals have been pre-emphasized, control goes to a step S102 (N), thereby issuing a signal indicating no de-emphasis to the ROM 18. Thereafter, the coefficient set K1 (shown in FIG. 2) is designated for the succeeding filtering operation, so that the multiplication coefficients are set in the respective multipliers in a step S104. The digital audio signals successively arriving from the input/output unit 24 in are converted according to the transmission function expressed by the formula (1). In this case, the coefficient set K1 is −1, 0 and 0, so that the transmission function is "−1". Therefore, the received signals will be multiplied by "−1". The digital filter functions as a filter whose gain is 0 dB and whose frequency characteristics are flat as shown by a solid line 33 in FIG. 7. In other words, the digital filter functions as a flat filter. In this case, output signals are phase-shifted by from the input signals. This shift is substantially negligible.

When there is no de-emphasizing process, "−1" is adopted as a filtering coefficient of degree 0 for the following reason. As shown in FIG. 6, there exists no value "1" in the binary code for representing the two's complements to be handled by the digital filter. In other words, it is natural that the filtering coefficient of degree 0 be "1" while the other filtering coefficients be "0". However, since the value "1" does not exist as the two's complement, the value "−1" is adopted in place of "1".

Referring to FIG. 5, the actual operation of the digital filter will be described hereinafter.

Step 1:
(1-1): Data $X_n$ input to the input/output unit 24 are output to the second bus 21.
(1-2): Data $X_{n-1}$ preceding the data $X_n$ shown in FIG. 3 are read from the RAM 22, and are input to the accumulator 14 via the first bus 16.
(1-3): The multiplier 11 multiplies the input data $X_n$ and the coefficient h(0) together to derive $M_1$.

Step 2:
(2-1): The data $X_n$ are output to the second bus 21.
(2-2): Data "0" are output to the accumulator 14 via the first bus 16.
(2-3): The multiplier 11 multiplies the input data $X_n$ and the coefficient h(1) together to derive $M_1$.
(2-4): The adder 13 adds $M_0$ and $E_{n-1}$ so as to derive a filter output $y_n$.

Step 3:
(3-1): The value $y_n$ of the accumulator is output to the second bus 21.
(3-2): The multiplier 11 multiplies $y_n$ and the coefficient h(2) together so as to derive $M_2$.
(3-3): The adder 13 adds $M_1$ and data "0" so as to derive $A_0$.

Step 4:
The adder 13 adds $M_2$ and $A_0$ to derive $E_n$.

Step 5:
$E_n$ is written into the RAM 22.

The foregoing processing cycle is executed for each piece of input data, thereby converting the signals according to the transmission function expressed by the formula (1).

According to the present invention, only the routine for selecting either set of the multiplication coefficients to be read from the ROM 18 is added to the essential filtering routine so as to de-emphasize the signals.

In the foregoing embodiment, the 4-bit two's complement data are used as the filtering coefficients. However, the invention is not limited to this, and the filtering coefficients may be 8 bits, or more than 16 bits.

When n is an integer having a positive sign, data showing the two's complement data by "n" bits may be $2^n$ kinds between "−1" and "$(2^{n-1}-1)/2^{n-1}$".

With the present invention, the two sets of filter coefficients are stored in the same one ROM, but may be separately stored in a plurality of ROMS's. In addition, a non-volatile memory such as an EPROM may be used as the ROM.

In the foregoing embodiment, whether or not the input digital audio signals have been pre-emphasized is automatically checked, but it may be checked by a manual operation.

As described so far, when no de-emphasis is required, the filtering coefficient of degree 0 is "−1" and the other filter coefficient is "0". The input signals are multiplied by "−1", so that no filtering will be executed. Therefore, no special selector circuit will be necessary for the reproduced audio signals, and no extra routine will be required when the de-emphasis is necessary. In summary, the filtering function can be advantageously carried out according to the existing filtering routine.

What is claimed is:

1. A digital filter for use in a digital audio device, the filter comprising a multiplier, a delay circuit, and an adder to filter input signals having particular characteristics according to filtering coefficients applied in the multiplier, wherein the multiplier receives the input signals and provides an output signal to an input terminal of the delay circuit, wherein the delay circuit provides an output signal to an input terminal of the adder, the adder providing an output signal to an output bus which is coupled to a second input terminal of the adder, said digital filter including:

a first memory for storing first filtering coefficients for filtering the particular characteristics of the input signals, the first filtering coefficients being binary data indicating two's complements which are expressed by $2^n$ kinds of data between "−1" and "$(2^{n-1}-1)/2^{n-1}$", and wherein a transmission function H(z) for filtering the particular characteristics is expressed by a filter coefficient h(0) of degree 0, a filter coefficient h(1) of degree 1, and a filter coefficient h(2) of degree 2 according to the following formula:

$$H(z)=(h(0)+h(1)Z^{-1})/(1+h(2)^{-1});$$

a second memory for storing second filtering coefficients comprising "−1" as the filtering coefficient of degree 0 and "0" as the filtering coefficients for other degrees;

a filtering coefficient setting means for setting in said multiplier the first filtering coefficients stored in said first memory to filter the particular characteristics of the input signal, and for setting in said multiplier the second filtering coefficients stored in said second memory when the particular characteristics of the input signal are not present to be filtered; and a decision means responsive to a control signal which is provided to the decision means prior to the reception of the input signals, said filtering coefficient setting means setting either said first or second coefficients according to the determination of said decision means.

2. A digital filter as defined in claim 1, wherein the input signals are digital audio signals which are to be filtered, wherein said digital audio signals are recorded on a medium and wherein said control signal is recorded on the same medium with the digital audio signals.

3. A digital filter as defined in claim 1 or 2, wherein said first and second memories comprise a read-only memory (ROM).

4. A digital filter as defined in claim 1 or 2, wherein said input signals are pre-emphasized by an amount to raise signal levels in a high frequency band, said first filtering coefficients for de-emphasizing the raised signal levels in the high frequency band by the amount.

* * * * *